United States Patent
Akiyama et al.

(10) Patent No.: US 9,214,380 B2
(45) Date of Patent: Dec. 15, 2015

(54) SOS SUBSTRATE HAVING LOW SURFACE DEFECT DENSITY

(71) Applicant: SHIN-ETSU CHEMICAL CO., LTD., Tokyo (JP)

(72) Inventors: Shoji Akiyama, Annaka (JP); Atsuo Ito, Tokyo (JP); Yuji Tobisaka, Annaka (JP); Makoto Kawai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 88 days.

(21) Appl. No.: 13/946,206

(22) Filed: Jul. 19, 2013

(65) Prior Publication Data

US 2014/0030870 A1 Jan. 30, 2014

Related U.S. Application Data

(62) Division of application No. 13/320,655, filed as application No. PCT/JP2010/058824 on May 25, 2010, now abandoned.

(30) Foreign Application Priority Data

May 29, 2009 (JP) ................................ 2009-130969

(51) Int. Cl.
*H01L 21/30* (2006.01)
*H01L 21/762* (2006.01)
(Continued)

(52) U.S. Cl.
CPC ........ *H01L 21/76254* (2013.01); *H01L 21/265* (2013.01); *H01L 21/268* (2013.01); *H01L 21/26506* (2013.01)

(58) Field of Classification Search
CPC ............ H01L 21/2007; H01L 21/2011; H01L 21/76275; H01L 21/76251; H01L 21/76254
USPC .................. 438/455, 459, 478, 479; 257/347, 257/E21.121, E21.122, E21.567, E21.568, 257/E27.112
See application file for complete search history.

(56) References Cited

U.S. PATENT DOCUMENTS 5,310,446 A * 5/1994 Konishi et al. .................. 117/58
6,224,668 B1 5/2001 Tamatsuka
(Continued)

FOREIGN PATENT DOCUMENTS

EP 1 986 218 A1 10/2008
(Continued)

OTHER PUBLICATIONS

Toshio Yoshii, Shinji Taguchi, Tomoyasu Inoue, and Hiroyuki Tango, Improvement of SOS Device Performance by Solid-Phase Epitaxy, Proceedings of the 13th Conference on Solid State Devices, Tokyo, 1981; Japanese Journal of Applied Physics, vol. 21 (1982) Supplement 21-1, pp. 175-179.
(Continued)

Primary Examiner — Jay C Kim
(74) Attorney, Agent, or Firm — Roberts Mlotkowski Safran & Cole, PC; David S. Safran

(57) ABSTRACT

Method of making a bonded SOS substrate with a semiconductor film on or above a sapphire substrate by implanting ions from a surface of the semiconductor substrate to form an ion-implanted layer; activating at least a surface of one of the sapphire substrate and the semiconductor substrate from which the ions have been implanted; bonding the surface of the semiconductor substrate and the surface of the sapphire substrate at a temperature of from 50° C. to 350° C.; heating the bonded substrates at a maximum temperature of from 200° C. to 350° C.; and irradiating visible light from a sapphire substrate side or a semiconductor substrate side to the ion-implanted layer of the semiconductor substrate to make the interface of the ion-implanted layer brittle at a temperature of the bonded body higher than the temperature at which the surfaces were bonded, to transfer the semiconductor film to the sapphire substrate.

10 Claims, 4 Drawing Sheets

(51) Int. Cl.
*H01L 21/265* (2006.01)
*H01L 21/268* (2006.01)

(56) References Cited

U.S. PATENT DOCUMENTS

| | | | |
|---|---|---|---|
| 6,284,628 B1 * | 9/2001 | Kuwahara et al. | 438/459 |
| 6,335,263 B1 * | 1/2002 | Cheung et al. | 438/455 |
| 6,486,008 B1 * | 11/2002 | Lee | 438/149 |
| 6,838,358 B2 * | 1/2005 | Maurice et al. | 438/458 |
| 7,122,865 B2 | 10/2006 | Hölzl et al. | |
| 7,416,924 B2 * | 8/2008 | Noguchi et al. | 438/149 |
| 7,588,998 B2 * | 9/2009 | Fehrer et al. | 438/458 |
| 7,977,209 B2 * | 7/2011 | Akiyama et al. | 438/458 |
| 8,232,182 B2 * | 7/2012 | Kim et al. | 438/458 |
| 8,263,476 B2 * | 9/2012 | Ohnuma | 438/458 |
| 2009/0061591 A1 * | 3/2009 | Akiyama et al. | 438/406 |
| 2009/0111237 A1 * | 4/2009 | Akiyama et al. | 438/406 |
| 2009/0179160 A1 * | 7/2009 | Tsukamoto et al. | 250/492.2 |
| 2010/0084746 A1 | 4/2010 | Akiyama et al. | |
| 2012/0119336 A1 | 5/2012 | Akiyama | |
| 2012/0126362 A1 | 5/2012 | Akiyama et al. | |

FOREIGN PATENT DOCUMENTS

| | | | |
|---|---|---|---|
| EP | 2 128 891 A1 | 12/2009 | |
| JP | 2005-005711 A | 1/2005 | |
| JP | 2007-214304 | * 8/2007 | ............. H01L 21/02 |
| JP | 2007-227415 A | 9/2007 | |
| WO | 2008/105101 A1 | 9/2008 | |

OTHER PUBLICATIONS

T. Ohmi et al., Soi No Kagakuk, Published by Realize Science & Engineering Center Co in 2000, Section 2, Paragraph 2, pp. 59-66, English Concise Explanation of Document.

European Patent Office, Supplementary European Seach Report of Corresponding Application No. EP 10 78 0542, Dated Dec. 19, 2012, Cited in Parent.

English Translation of International Search Report for International Application No. PCT/JP2010/058824 Dated August 24, 2010, Cited in Parent.

* cited by examiner

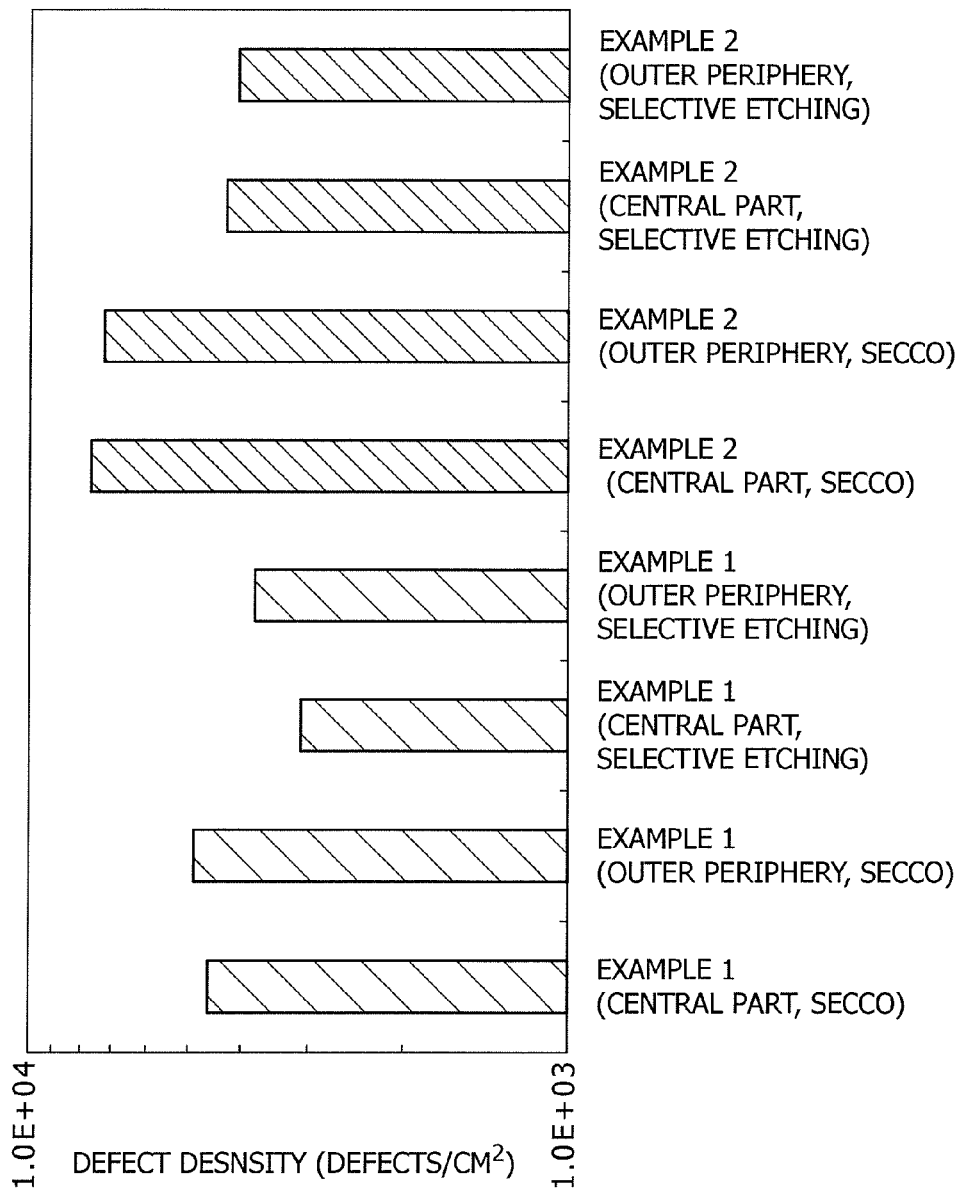

SOS SUBSTRATE HAVING LOW SURFACE DEFECT DENSITY

CROSS REFERENCE TO RELATED APPLICATION

This application is a division of commonly owned, co-pending U.S. patent application Ser. No. 13/320,655, filed Jan. 30, 2012.

BACKGROUND OF THE INVENTION

1. Field of the Invention

The invention relates to method of preparing a silicon-on-sapphire SOS substrate having a low surface defect density.

2. Description of Related Art

Conventionally, a silicon-on-sapphire (SOS) substrate containing sapphire having a high insulation property, a low dielectric loss and a high thermal conductivity as a handle substrate has come into practical use since 1960s. The SOS substrate is an oldest silicon-on-insulator (SOI) substrate and forms an SOI structure by heteroepitaxially growing silicon on an R surface (1012) of sapphire.

However, recently, an SOI using a SIMOX method, the bonding method and the like has become a main stream. Although an SOS substrate, which is a SOI substrate having silicon on a sapphire substrate, cannot cope, the SOS substrate has been used only for a device such as a high frequency device requiring a low dielectric loss. It is known that since a heteroepitaxial SOS substrate is formed by heteroepitaxially growing silicon on sapphire of which lattice constant is 12% different from that of silicon, many defects due to the mismatch of lattice magnitude are generated (see, for example, Yoshii et al., Japanese Journal of Applied Physics, Vol. 21 (1982) Supplement 21-1, pp. 175-179).

Recently, use of a mobile communication represented by a mobile phone has been widely spread so that a demand for the high frequency device has been increased. Use of an SOS substrate has been considered in this field. However, use of the heteroepitaxial SOS substrate is limited to small individual parts, such as a switch, at present since a defect density is high.

It has been reported that the surface defect density of the heteroepitaxial SOS substrate is about 109 pieces/cm2 in a Secco defect detection method (a mixed solution of K2Cr2O7 or Cr2O3 and HF), a selective etching defect detection method (a mixed solution of HF, KI, I and CH3OH) or the like (see, for example, Yoshii et al., Japanese Journal of Applied Physics, Vol. 21 (1982) Supplement 21-1, pp. 175-179).

To reduce the defects of the heteroepitaxial SOS substrate, there is proposed a method comprising the steps of ion-implanting high concentration Si in the vicinity of the interface between a Si film and a sapphire substrate, making a remaining Si surface amorphous, and annealing at about 600° C. to gradually recrystalize an amorphous layer from a surface side having a less amount of defects. This method is called a single solid phase growth. Further, there is also proposed a method of repeating the above method twice for trying to reduce defects further (see, for example, Yoshii et al., Japanese Journal of Applied Physics, Vol. 21 (1982) Supplement 21-1, pp. 175-179). This method is called a double solid phase growth.

However, even if the double solid phase growth method is used, the defect density is about 106 to 107 pieces/cm2 so that it is difficult to make a recent highly downscaled and sophisticated device. Further, it is also difficult to make a relatively large size device such as a system chip having many functions. It can be said that this is due to an essential problem of the heteroepitaxial growth (an epitaxial growth of materials having different lattice constants).

SUMMARY OF THE INVENTION

In view of the current circumstances, an object of the invention is to solve a problem that a defect density increases due to lattice constant mismatch between silicon and sapphire, thereby providing an SOS substrate having a low defect density.

To solve the problem, the inventors have reached the following manufacturing method.

According to the invention, provided is a method for manufacturing an SOS substrate comprising a single crystal silicon layer on or above a surface of a sapphire substrate (handle), the method comprising the steps of: in this order, implanting ions into a silicon substrate or a silicon substrate with an oxide film thereon to form an ion-implanted layer; activating at least a surface selected from the surface of the sapphire substrate and a surface of the silicon substrate or the silicon substrate with the oxide film thereon from which the ions have been implanted; bonding the silicon substrate or the silicon substrate with the oxide film thereon to the sapphire substrate; heating the bonded substrates at a temperature of from 200° C. to 350° C. to form a bonded body; and irradiating visible light from a sapphire substrate side of the bonded body to the ion-implanted layer of the silicon substrate or the silicon substrate with the oxide film thereon for making an interface of the ion-implanted layer brittle so as to transfer a silicon film to the sapphire substrate.

According to the present invention, an SOS substrate having approximately the same defect density (about 104 pieces/cm2; see Realize Science & Engineering Center Co., Ltd., "Science of SOI", Item 2 of Paragraph 2 in Chapter 2) as a bonded SOT substrate is provided so that an integrated device can be realized.

BRIEF DESCRIPTION OF THE DRAWINGS

FIG. 3 is a graph of defect densities measured by changing defect-detecting sites of a bonded SOS substrate of the invention (a wafer outer peripheral part or a wafer central part) and defect detecting methods (Secco or elective etching).

DETAILED DESCRIPTION OF THE INVENTION

Figure 1:
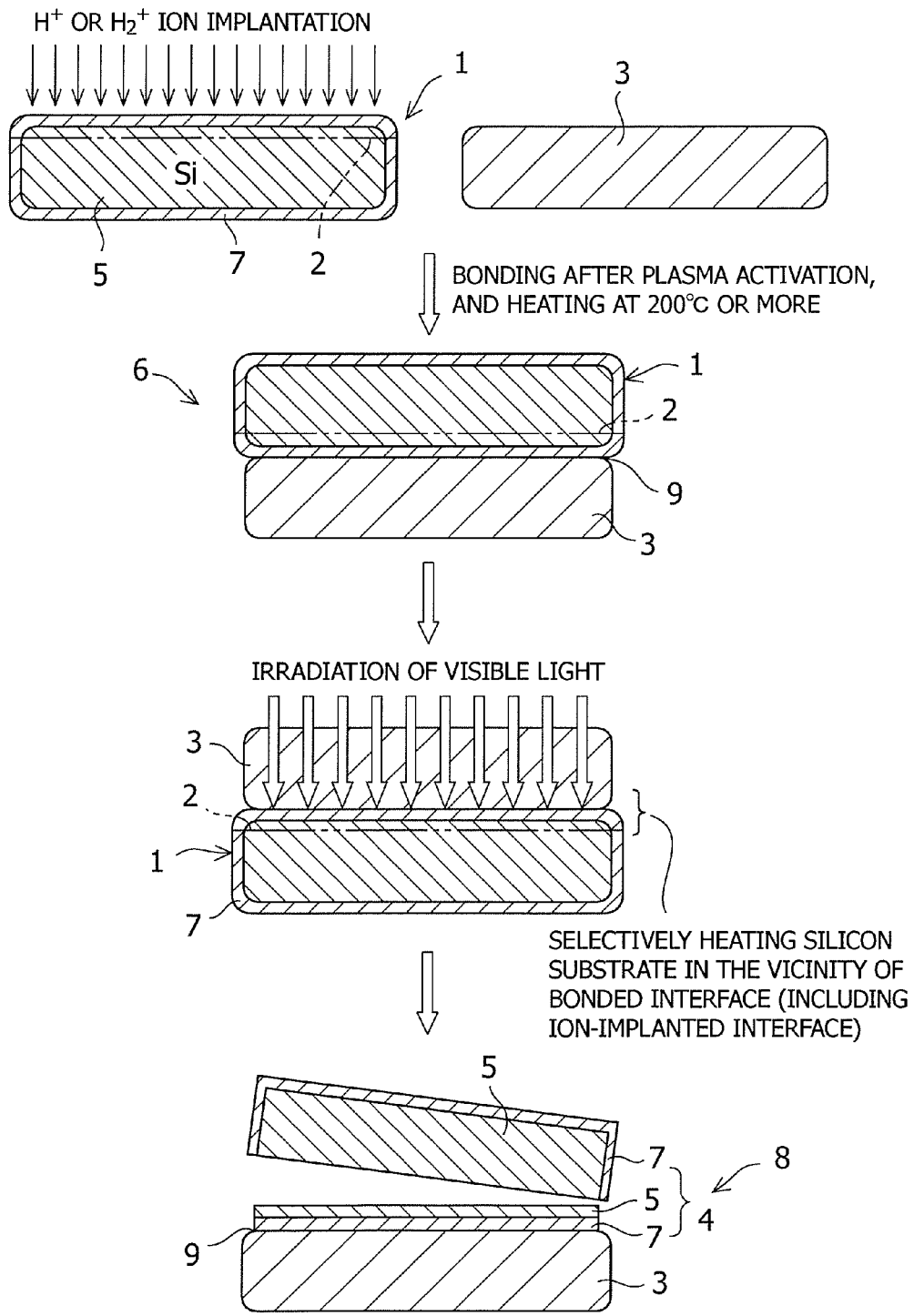
FIG. 1 exhibits steps of an embodiment of a method for manufacturing a bonded SOS substrate of the invention.

According to the invention, an SOS substrate comprises a single crystal silicon film formed on or above a sapphire substrate and the defect density of the surface of the single crystal silicon film which is measured by a Secco defect detection method and a selective etching defect detection method is 104 pieces/cm2 or less.

The Secco defect detection method and the selective etching defect detection method are well-known by a person skilled in the art so that an explanation of these detection methods is omitted. These detection methods are typically carried out after a single crystal silicon film is polished to a predetermined thickness by the CMP polishing.

According to the invention, the thickness of the single crystal silicon film in the SOS substrate can be more than 100 nm. The thickness within such a range is advantageous in that the defect density of the bulk part is not so high as compared with the defect density in the vicinity of the interface between a silicon film and a sapphire substrate. Thus, the silicon film is not likely to be affected by the defects in the vicinity of the interface. Further, when the silicon film is thick, there is an advantage that the silicon film can be easily treated because electric properties are relatively insensitive to a thickness variation. The upper limit of the thickness can be, for example, 500 nm.

According to the invention, the SOS substrate can keep the thickness variation of a single crystal silicon film in the range of 20 nm or less. When the silicon film is thick, it is advantageous in that the silicon film can be treated easily because the electric properties are relatively insensitive to the thickness variation. According to the invention, the SOS substrate can further improve the electric properties because the thickness variation is small. According to the invention, in the method for manufacturing the SOS substrate, splitting and transferring are regulated by an ion-implanted interface so that it becomes easy to keep the film thickness variation within the above range after transferring.

The film thickness of the single crystal silicon film is measured by an optical interference type film thickness meter and is an average value within a diameter of about 1 mm which is the spot diameter of measuring beam light. The thickness variation is a value defined by the square root of the square sum of the offset of the film thickness from an average value of film thickness when 361 measuring points are radially provided.

According to the invention, the SOS substrate preferably comprises a silicon oxide film between the single crystal silicon film and the sapphire substrate. This is because the channeling of the implanted ions can be suppressed. Such an SOS substrate can be obtained, for example, by using the bonding method, which will be described later, where an insulation film such as a silicon oxide film is formed on a surface of a silicon wafer prior to the step of ion-implanting.

According to the invention, the SOS substrate can be particularly preferably used in the manufacture of various types of devices in which an SOI layer is allowed to function as a partial depletion.

Examples of such semiconductor devices include a CPU and a system chip provided with many arithmetic processing functions, a high frequency device such as a microwave device and a millimeter wave device requiring a small dielectric loss, and a substrate for an electric engineering device such as a liquid crystal device.

According to the invention, even if the SOS substrate has a diameter of 100 mm or more, it can keep the defect density within the above range. When the defect density is within the range, the upper limit of the diameter can be, for example, 300 mm.

The SOS substrate is preferably manufactured by the bonding method. The bonding method is advantageous in that the correlation between the defect density in the vicinity of a sapphire/silicon interface and the defect density in the bulk part can be made small as compared with the epitaxial growth method.

The bonding method may include a method of thermal splitting by the relocation effect of crystals and the aggregation effect of injected hydrogen bubbles when a bonded body is heated under an inert gas atmosphere at about 500° C., and a method of splitting at an hydrogen ion-implanted interface by making the temperature of one surface of the bonded substrates differ from that of the other surface thereof. The bonding method is preferably the method for manufacturing the SOS substrate according to the invention.

The manufacturing method of the SOS substrate according to the invention will be described in detail based on FIG. 1.

First, as a semiconductor substrate, for example, a silicon substrate or a silicon substrate 1 with an oxide film thereon (unless otherwise distinguished, simply described as a silicon wafer hereinafter) is subjected to ion implantation to form an ion-implanted layer 2.

The ion-implanted layer 2 is formed inside a silicon wafer. Hydrogen ions (H+) or hydrogen molecule ions (H2+) of a predetermined dose is implanted by using implantation energy with which the ion-implanted layer can be formed to a desired depth from the surface of the silicon wafer. As a condition, for example, the implantation energy can be 30 to 100 keV.

The dose amount of the hydrogen ion (H+) implanted to the silicon wafer is preferably $1.0 \times 10^{16}$ atom/cm2 to $1.0 \times 10^{17}$ atom/cm2. When the dose amount is less than $1.0 \times 10^{16}$ atom/cm2, an interface may not become brittle. When the dose amount is more than $1.0 \times 10^{17}$ atom/cm2, the interface may have bubbles during heating after bonding so that transferring may be insufficient. The dose amount is more preferably $6.0 \times 10^{16}$ atom/cm2.

When hydrogen molecule ion (H2+) is used as the implanted ions, the dose amount thereof is preferably $5.0 \times 10^{15}$ atoms/cm2 to $5.0 \times 10^{16}$ atoms/cm2. When the dose amount is less than $5.0 \times 10^{15}$ atoms/cm2, an interface may not become brittle. When the dose amount is more than $5.0 \times 10^{16}$ atoms/cm2, the interface may have bubbles during heating after bonding so that transferring may be insufficient. The dose amount is more preferably $2.5 \times 10^{16}$ atom/cm2.

Further, when an insulating film such as a silicon oxide film having about several nanometers to 500 nm is formed on the surface of the silicon wafer and hydrogen ions or hydrogen molecule ions are implanted through the insulating film, channeling of the implanted ions can be suppressed.

Next, the surface of the silicon wafer 1 and/or the surface of the sapphire substrate 3 is activated. Suitable methods of surface activation include plasma treatment, ozone water treatment, UV ozone treatment and ion beam treatment. In the plasma treatment, a sapphire substrate and/or a silicon wafer which has been subjected to cleaning such as RCA cleaning is placed in a vacuum chamber, and exposed to high frequency plasma of about 100 W for about 5 to 10 seconds after introduction of plasma gas at a reduced pressure. Thus, the surface of the sapphire substrate and/or the surface of the silicon wafer is subjected to the plasma treatment. As the plasma gas, when the surface of the silicon wafer is desirably oxidized, plasma of oxygen gas can be used. When the surface of the silicon wafer is desirably not oxidized, a hydrogen gas, an argon gas, a mixed gas of a hydrogen gas and an argon gas, or a mixed gas of a hydrogen gas and a helium gas can be used. When the sapphire substrate is treated, any of the gases can be used.

In the plasma treatment, the organic substance on the surface of the silicon wafer and/or the sapphire substrate is oxidized and removed, and further the OH radical on the surface is increased for surface activation. Although the treatment of both of the surfaces, the surface of the silicon wafer from which the ions are implanted and a bonding surface of the sapphire substrate, is more preferable, the treatment of any one of the surfaces may be done.

In the ozone treatment, it is characterized that an ozone gas is introduced into pure water and then activates a surface of the wafer by active ozone.

In the UV ozone treatment, UV light having a short wavelength (wavelength of about 195 nm) is irradiated on the atmosphere or an oxygen gas to generate active ozone for surface activation.

In the ion beam treatment, an ion beam such as Ar ion beam is applied to the wafer surface in a high vacuum (<1×10-6 Torr) so as to expose a dangling bond having a high degree of activity for surface activation.

The surface of the silicon wafer to be subjected to the surface activation treatment is preferably a surface from which the ions have been implanted.

In the invention, although the thickness of the silicon wafer is not particularly limited, a silicon wafer having a thickness close to that of an ordinary SEMI/JEIDA standard can provide easy handling.

The sapphire substrate preferably has a smaller energy loss until light in a visible light region (wavelength 400 nm to 700 nm) reaches the ion-implanted layer of the bonded silicon wafer. A substrate is not particularly limited insofar as it has the transmittance of 70% or more in the visible light region. The substrate is preferably of quartz, glass or sapphire in consideration of excellence in insulation and transparency.

In the invention, although the thickness of the sapphire substrate is not particularly limited, a sapphire wafer having a thickness close to that of the ordinary SEMI/JEIDA standard can provide easy handling.

Next, the surface of the silicon wafer 1 and the surface of the sapphire substrate 3 are bonded, where the surface or surfaces subjected to plasma and/or ozone treatment are used as bonding surfaces.

Next, the bonded substrates are heated at a maximum temperature of from 200° C. to 350° C. to obtain a bonded body 6. A reason why the step of heating is comprised is to prevent a crystal defect from being generated by dislocation of a bonded interface 9. The dislocation is caused by an abrupt temperature increase when the bonded interface 9 becomes a high temperature by irradiation of visible light in the later step. The maximum temperature is from 200° C. to 350° C. When the maximum temperature is less than 200° C., a bonding strength does not increase. When the maximum temperature is more than 350° C., there is a possibility that the bonded substrates may be damaged.

Heating time is preferably 12 hours to 72 hours although the time also depends on temperature to some extent.

Next, prior to irradiation of the visible light, a mechanical impact may be applied to a side near the bonded interface 9 of the bonded body 6. The mechanical impact to the vicinity of the bonded interface allows the splitting to start at one position when visible light is irradiated. Because the splitting spreads to the overall surface of the wafer from the position, there is an advantage that a film can be easily transferred.

Subsequently, the substrate is cooled to a room temperature when desired, and subjected to annealing by irradiating visible light from the sapphire substrate 3 side or the semiconductor substrate 1 side of the bonded body 6 toward the ion-implanted layer 2 of the silicon wafer 5.

In the description, "visible light" is light having a maximal wavelength within the range of 400 to 700 nm. The visible light may be coherent light or incoherent light.

The temperature of the bonded body 6 during irradiation of the visible light is preferably 30° C. to 100° C. higher than the temperature for bonding.

A reason for preferably irradiating light at the higher temperature can be explained as follows without limiting the scope of the invention. When the substrates bonded at high temperature are returned to a room temperature after they have been heated and obtained a sufficient bonding strength, the substrates are warped due to a difference in the thermal expansion coefficient for both of the substrates. Thus, the experiments by the inventors have found that when light is irradiated to the substrates, a defect is generated in the semiconductor film and the substrates themselves are damaged in some cases. It is because a stress is rapidly released during transfer of a film and the substrates tend to return to a flat state.

The irradiation of light at the higher temperature can avoid the damage of the substrate.

To irradiate light in the state that the substrates are flat, it is preferable to raise the temperature of the substrates to the temperature close to the temperature during bonding. It is important that the wafer is heated during irradiation.

When annealing is carried out using a laser beam as an example of the visible light, the laser beam reaches the silicon substrate 1 without heating the sapphire substrate 3 because the laser beam passes through the sapphire substrate 3 with almost no absorption by the sapphire substrate 3. The reached laser beam selectively heats only the vicinity (including the bonded interface) of the bonded interface 9 of silicon, especially the part made amorphous by the hydrogen ion implantation, thereby prompting embrittlement of the ion-implanted part.

Further, only a very small part of the silicon substrate 1 (only the silicon in the vicinity of the bonded interface 9) is heated instantly so that the substrates are not cracked and not warped after cooled.

The wavelength of the laser used here is preferably a wavelength which is relatively easily absorbed by silicon (700 nm or less), and absorbed by amorphous silicon but hardly absorbed by a single crystal silicon part so that the part made amorphous by the hydrogen ion implantation can be selectively heated. A suitable wavelength region may be from 400 nm to 700 nm, preferably from 500 nm to 600 nm. A laser in this wavelength region includes, but is not limited to, a secondary harmonic wave of an Nd:YAG laser (wavelength λ=532 nm), a secondary harmonic wave of a YVO4 laser (wavelength λ=532 nm).

It is noted that, when an ion-implanted part 2 is excessively heated by irradiation of the laser, a thermal splitting is partially generated so that a bulging defect called a blister is generated. This is visually observed from the sapphire substrate side of the bonded SOS substrate. Once splitting begins by the blister, a stress is localized in the bonded SOS substrate, thereby causing breakage of the bonded SOS substrate. Accordingly, it is important to irradiate the laser to the extent that the thermal splitting is not generated and to carry out a mechanical splitting thereafter. Alternatively, it is important to apply the mechanical impact to the side of the bonded SOS substrate at the vicinity of the bonded interface 9 prior to the irradiation of the laser and to cause a thermal impact due to irradiation of the laser to generate the destruction of the ion-implanted interface from the start point of the mechanical impact to the overall interface of the bonded SOS.

As for an irradiation condition of the laser, when a laser having an output of 50 W to 100 W and an oscillation frequency of 25 mJ at 3 kHz is used, irradiation energy per area is preferably 5 J/cm2 to 30 J/cm2 in our experience. When the energy is 5 J/cm2 or less, there is a possibility that the embrittlement does not occur in the ion-implanted interface. When the energy is more than 30 J/cm2, there is a possibility that the substrate is damaged because the embrittlement is excessively strong. In the irradiation, a spot-shaped laser beam is scanned over the wafer so that it is difficult to specify the scanning time. The scanning time is desirably selected in such a manner that the irradiation energy after treatment is within the above range.

Further, it is also possible to apply an RTA (Rapid Thermal Anneal) including spike anneal in the place of said laser anneal. The RTA system is equipment which contains a halogen lamp as a light source and can heat the wafer to a target temperature at a very rapid rate of 30° C./sec to 200° C./sec. The wavelength emitted from the halogen lamp has high emission intensity in the visible light region according to black radiation. The spike anneal does not have a particular boundary and is the anneal which has a particularly rapid temperature increase rate (for example, 100° C./sec or more) in the RTA. Since a temperature increases at a very rapid rate and sapphire is not heated in such a wavelength band (by radiation), silicon becomes heated before sapphire does, which is preferable to make the ion-implanted interface brittle. In the RTA, a process has been finished when sufficient heat is transmitted to sapphire.

Further, it is also possible to apply a flash lamp anneal in the place of said laser anneal. As for the wavelength of the flash lamp used here, a flash lamp having a peak intensity in the wavelength region of from 400 nm to 700 nm, which is the wavelength region in which light is efficiently absorbed by silicon, is preferable although it is inevitable that the flash lamp has a certain degree of wavelength region as long as it is a lamp. When the wavelength is less than 400 nm, even single crystal silicon also has a high absorption coefficient. When the wavelength is more than 700 nm, even amorphous silicon also has a low absorption coefficient. A suitable wavelength region is from about 400 to about 700 nm. As for a lamp light source which meets the wavelength region, heating by a xenon lamp is typically employed. The xenon lamp has a peak intensity (at 700 nm or less) in the vicinity of 500 nm, which is suitable for the object of the invention.

When xenon lamp light is used, the light may be irradiated through a wavelength filter which cuts the light other than the light in a visible light region. Further, a filter or like which has a high absorption coefficient in single crystal silicon and shields visible light of 450 nm or less, is also effective for stabilizing a process. To suppress the generation of blister described above, it is preferable to irradiate the overall surface of the bonded SOS substrate all at once by the xenon lamp light. All irradiation at once can prevent the localization of stress in the bonded SOS substrate so that the destruction of the bonded SOS substrate can be easily prevented. Accordingly, it is important to irradiate the xenon lamp light to the extent that no thermal splitting is generated and to carry out the mechanical splitting thereafter. Alternatively, it is important that the mechanical impact is applied to the side at the vicinity of the bonded interface of the bonded SOS substrate prior to irradiation of the xenon lamp light so that the thermal impact due to the irradiation of the xenon lamp light generates destruction of the ion-implanted interface from the start point of the mechanical impact to the overall interface of the bonded SOS substrate.

When it is not confirmed that the silicon film has been transferred to the sapphire substrate after irradiation of the laser beam, the RTA, or irradiation of the flash lamp, application of the mechanical impact to the interface can split the bonded body along the interface of the ion-implanted layer, thereby transferring the single crystal silicon film to the sapphire substrate.

To apply the mechanical impact to the interface of the ion-implanted layer, for example, a jet of a fluid, such as a gas or a liquid, can be blown continuously or intermittently to a side surface of the bonded wafer. Any method in which a mechanical splitting can be generated by an impact is applicable without particular limitation.

According to the invention, the SOS substrate 8 in which the single crystal silicon film 4 is formed on the sapphire substrate 3 can be obtained as a result of splitting.

Since a damaged layer of about 150 nm remains on a surface of the single crystal silicon film just after splitting, it is preferable to carry out CMP polishing. Removal of the damaged layer in its entirety by polishing increases the film thickness variation. Accordingly, in an actual process, a method of removing almost all the damaged layer by chemical etching and then mirror-polishing the surface of the damaged layer is reasonable.

An etching solution for chemical etching is preferably a solution of one or more selected from a group consisting of ammonia hydrogen peroxide, ammonia, KOH, NaOH, CsOH, TMAH, EDP and hydrazine. In generally, since the etching rate of an organic solvent is slow as compared with that of an alkaline solution, the organic solvent is suitable when it is necessary to control an accurate etching amount.

Since the CMP polishing is carried out to mirror-polish the surface, 30 nm or more of polishing is typically carried out.

After the CMP polishing and the mirror finish polishing, cleaning by a wet process such as RCA cleaning or spin cleaning, and/or cleaning by a dry process such as UV/ozone cleaning, HF vapor cleaning, may be carried out.

EXAMPLE 1

Figure 2A:
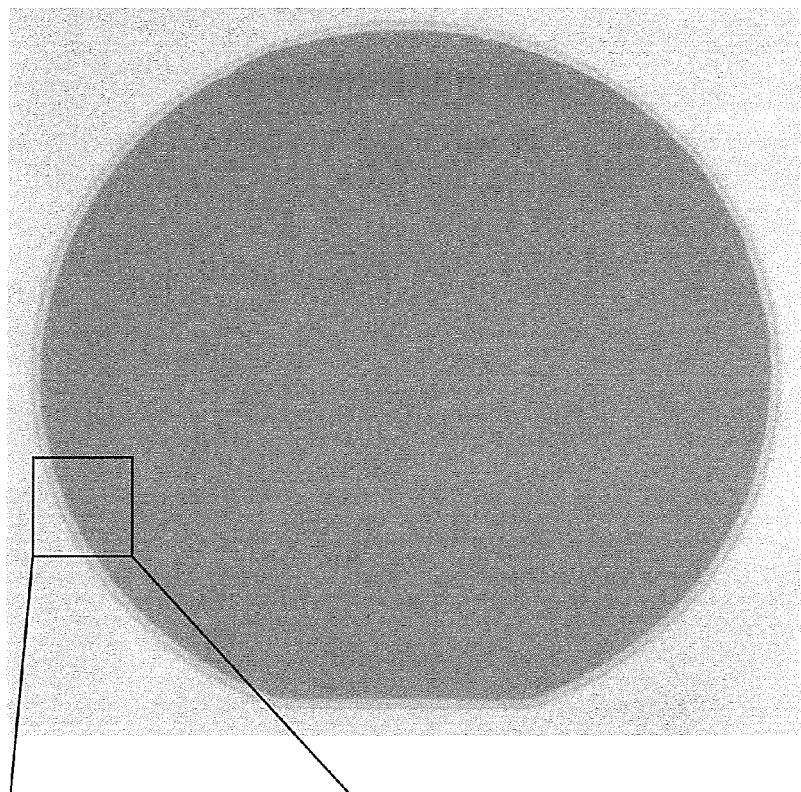
FIGS. 2(a) & 2(b) show an overall plan view and an enlarged plan view, respectively, of an outer peripheral section of a bonded SOS substrate in accordance with the invention.
Figure 2B:
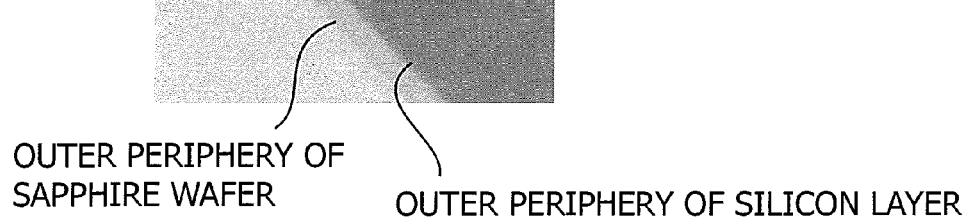

A silicon substrate (thickness 625 µm) having a diameter of 150 mm on which an oxide film had been grown to 200 nm was subjected to implantation of hydrogen ions at 57 keV and a dose amount of $6.0 \times 10^{16}$ atoms/cm2. Both surfaces of a sapphire substrate were subjected to ion beam activation treatment. Then the silicon substrate was bonded to the sapphire substrate at 150° C. After the bonded substrates were subjected to heat treatment at 225° C. for 24 hours for primary bonding, a green laser having a wavelength of 532 nm was irradiated from the sapphire substrate side at 200° C. A laser condition at the time was 20 J/cm2. After the overall surface of the substrate was irradiated, a silicon film was transferred to the sapphire substrate by splitting along the bonded interface to which a mechanical impact was applied. The transfer of the silicon film onto the overall surface of the sapphire substrate could be confirmed. After the silicon layer of the substrate was made to a thickness of 200 nm by CMP polishing, the number of defects of the central parts and the outer peripheral part of the substrate was counted by a Secco defect detection method and a selective etching method. The number of pits which could be confirmed by an optical microscope was from about $3 \times 10^3$ pieces/cm2 to about $5 \times 10^3$ pieces/cm2. The photographs of appearance of a bonded SOS prepared by the method are shown in FIGS. 2(a) & 2(b). Since splitting and transferring were regulated by an ion implanted interface, the film thickness variation after the transfer was suppressed to be 5 nm or less. The film thickness variation after the mirror finish polishing (CMP) was 20 nm or less.

EXAMPLE 2

A silicon substrate (thickness 625 µm) having a diameter of 150 mm on which an oxide film had been grown to 200 nm was subjected to implantation of hydrogen ions at 57 keV and a dose amount of $6.0 \times 10^{16}$ atoms/cm2. Both surfaces of a sapphire substrate were subjected to plasma activation treatment. Then the silicon substrate was bonded to the sapphire substrate at 200° C. After the bonded substrates were subjected to heat treatment at 225° C. for 24 hours for primary bonding, light from a xenon plash lamp was irradiated from the sapphire substrate side at 250° C. After the overall surface of the substrate was irradiated, a silicon film was transferred to the sapphire substrate by splitting along a bonded interface to which a mechanical impact was applied. The transfer of the silicon film onto the overall surface of the sapphire substrate could be confirmed. After the silicon layer of the substrate was made to a thickness of 200 nm by etching (an ammonia hydrogen peroxide solution) and CMP polishing, the number of defects of the central part and the outer peripheral part of the substrate was counted by a Secco defect detection method and a selective etching method. The number of defects was from about 4×10 3 pieces/cm2 to about 8×10 3 pieces/cm2. The defect densities are summarized in Table 1 and FIG. 3 together with the result of Example 1.

TABLE 1

| | Example 1 | | | | Example 2 | | | |
|---|---|---|---|---|---|---|---|---|
| location of defect density | center | periphery | center | periphery | center | periphery | center | periphery |
| defect detection method | Secco | Secco | selective etching | selective etching | Secco | Secco | selective etching | selective etching |
| defect density (no./cm2) | 4.5 × 10 3 | 4.9 × 10 3 | 3.0 × 10 3 | 3.5 × 10 3 | 8.0 × 10 3 | 7.2 × 10 3 | 4.1 × 10 3 | 4.0 × 10 3 |

In addition, as to all the samples, since splitting and transferring were regulated by an ion implanted interface, the film thickness variation after the transfer was suppressed to be 5 nm or less. The film thickness variation after the mirror finish polishing (CMP) was 20 nm.

EXAMPLE 3

Figure 4A:
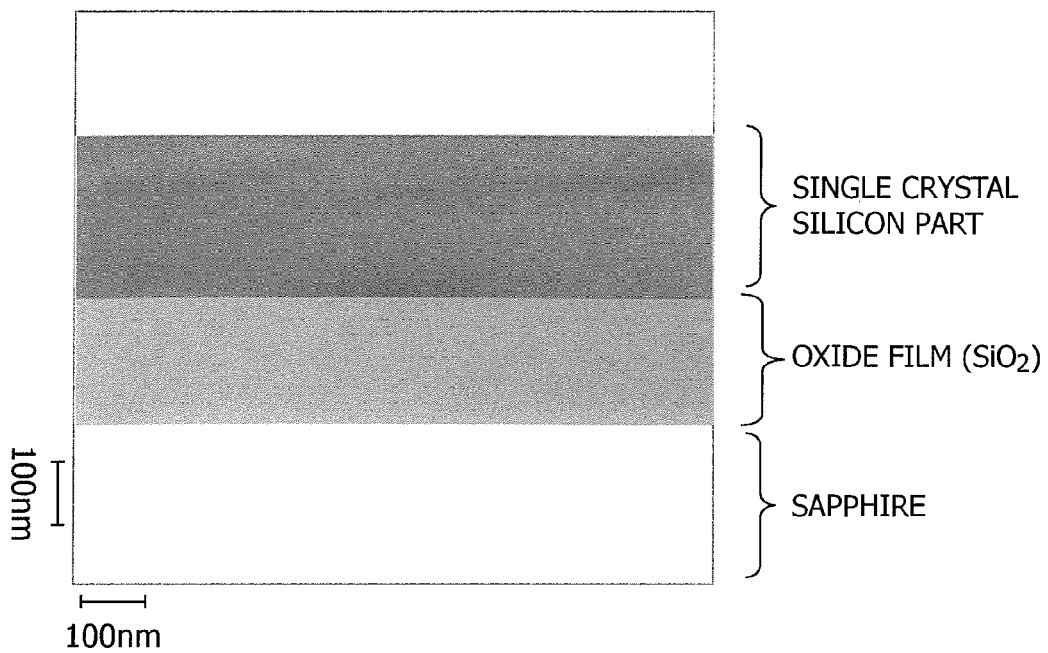
FIGS. 4(a) & 4(b) show a sectional view of the wafer central part and a sectional view of a wafer outer peripheral part, respectively, of a bonded SOS substrate in accordance with the invention.
Figure 4B:
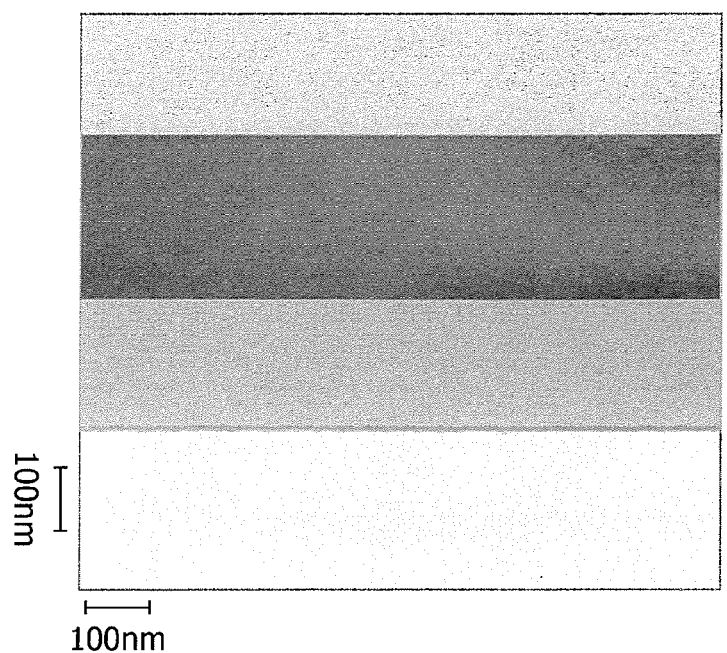

A silicon substrate (thickness 625 μm) having a diameter of 150 mm on which an oxide film had been grown to 200 nm was subjected to implantation of hydrogen ions at 57 keV and a dose amount of 6.0×1016 atoms/cm2. Both surfaces of a sapphire substrate were subjected to UV ozone activation treatment. Then, the silicon substrate was bonded to the sapphire substrate at 100° C. After the bonded substrates were subjected to heat treatment at 225° C. for 24 hours for primary bonding, light from a xenon flash lamp were irradiated from the sapphire substrate side at 175° C. After the overall surface of the substrate was irradiated, a silicon film was transferred to the sapphire substrate by splitting along a bonded interface to which a mechanical impact is applied. The film thickness was made to about 250 nm by EDP polishing and CMP polishing. Since splitting and transferring were regulated by an ion implanted interface, the film thickness variation after the transfer was suppressed to be 5 nm or less. The film thickness variation after the mirror finish polishing (CMP) was 20 nm or less. Cross-sectional TEM (transmission electron microscope) photographs of the substrate were taken at two positions, i.e. at a center and on an outer periphery. No defect was observed at all in a field of view having a narrow TEM level. FIG. 4 shows the photographs.

EXAMPLE 4

A silicon substrate (thickness 625 μm) having a diameter of 150 mm on which an oxide film had been grown to 200 nm was subjected to implantation of hydrogen ions at 57 keV and a dose amount of 6.0×1016 atoms/cm2. Both surfaces of a sapphire substrate were subjected to UV ozone activation treatment. Then the silicon substrate was bonded to the sapphire substrate at 100° C. After the bonded substrates were subjected to heat treatment at 225° C. for 24 hours for primary bonding, a RTA treatment was applied from the sapphire substrate side at 175° C. A temperature increasing rate was 50° C./sec and a temperature was reduced when the silicon layer reached 800° C. A silicon film was transferred to the sapphire substrate by splitting along a bonded interface to which a mechanical impact was applied. The film thickness was made to about 250 nm by EDP polishing and CMP polishing. Since splitting and transferring were regulated by an ion implanted interface, the film thickness variation after the transfer was suppressed to be 5 nm or less. The film thickness variation after the minor finish polishing (CMP) was 20 nm or less.

EXAMPLE 5

A silicon substrate (thickness 625 μm) having a diameter of 150 mm on which an oxide film had been grown to 200 nm was subjected to implantation of hydrogen ions at 57 keV and a dose of amount 6.0×1016 atoms/cm2. Both surfaces of a sapphire substrate were subjected to UV ozone activation treatment. Then, the silicon substrate was bonded to the sapphire substrate. After the bonded substrates were subjected to heat treatment at 225° C. for 24 hours for primary bonding, light from a halogen lamp was irradiated from the sapphire substrate side, and the bonded body was spike-annealed at 100° C. After the overall surface of the substrate was irradiated, a silicon film was transferred to the sapphire substrate by splitting along a bonded interface to which a mechanical impact was applied. The film thickness was made to about 250 nm by CMP polishing. Since splitting and transferring were regulated by an ion-implanted interface, the film thickness variation after the transfer was suppressed to be 5 nm or less. The film thickness variation after the mirror finish polishing (CMP) was 20 nm or less.

What is claimed is:
1. A method for preparing a bonded semiconductor-on-sapphire (SOS) substrate comprising a semiconductor film on a surface of a sapphire substrate, comprising the steps of:
   providing the sapphire substrate and a semiconductor substrate which is a single crystal silicon substrate or a silicon substrate on which an oxide film has been grown;
   implanting hydrogen atom ions ($H^+$) or hydrogen molecule ions ($H_2^+$) into a surface of the semiconductor substrate to form an ion-implanted layer;

activating one or both of the surface of the sapphire substrate and the surface of the semiconductor substrate into which the hydrogen atom ions or hydrogen molecule ions have been implanted;

bonding the surface of the semiconductor substrate and the surface of the sapphire substrate at a temperature of from 50° C. to 350° C.;

heating the bonded substrates to a temperature in a range of from 200° C. to 350° C. to form a bonded body; and irradiating visible light from a sapphire substrate side to the ion-implanted layer of the semiconductor substrate for making an interface of the ion-implanted layer brittle, while keeping a temperature of the bonded body higher than the temperature at which the surfaces of the semiconductor substrate and the sapphire substrate were bonded, so as to transfer the semiconductor film from the semiconductor substrate to the sapphire substrate, wherein the temperature of the bonded body during irradiation of the visible light is from 30° C. to 100° C. higher than the temperature at which the surfaces of the semiconductor substrate and the sapphire substrate were bonded, wherein the visible light is a laser beam having a wavelength in a range of from 400 to 700 nm and irradiation energy per area 5 J/cm$^2$ to 30 J/cm$^2$, halogen lamp light in a RTA (Rapid Thermal Anneal) including spike anneal, or flash lamp light having a peak intensity in a wavelength range of from 400 nm to 700 nm.

2. The method for preparing a bonded SOS substrate according to claim 1, wherein the step of activating comprises one or more selected from the group consisting of ozone water treatment, UV ozone treatment, ion beam treatment and plasma treatment.

3. The method for preparing a bonded SOS substrate according to claim 1, comprising a step of applying a mechanical impact to the interface of the ion-implanted layer to split the bonded body along the interface after the step of irradiating visible light.

4. The method for preparing a bonded SOS substrate according to claim 1, comprising a step of applying a mechanical impact to a side near the interface of the ion-implanted layer before the step of irradiating visible light.

5. The method for preparing a bonded SOS substrate according to claim 1, wherein the visible light is the laser beam.

6. The method for preparing a bonded SOS substrate according to claim 1, wherein the visible light is of the halogen lamp light in the RTA (Rapid Thermal Anneal) including spike anneal.

7. The method for preparing a bonded SOS substrate according to claim 1, wherein the visible light is the flash lamp light.

8. The method for preparing a bonded SOS substrate according to claim 1, wherein the implanted ions are hydrogen atom ions (H$^+$) and a dose amount thereof is from $1 \times 10^{16}$ atoms/cm$^2$ to $1 \times 10^{17}$ atoms/cm$^2$.

9. The method for preparing a bonded SOS substrate according to claim 1, wherein the implanted ions are hydrogen molecule ions (H$_2^+$) and a dose amount thereof is from $5 \times 10^{15}$ atoms/cm$^2$ to $5 \times 10^{16}$ atoms/cm$^2$.

10. The method for preparing a bonded SOS substrate according to claim 1, further comprising a step of chemically etching or chemical mechanical polishing (CMP) a surface of the transferred semiconductor film, wherein the etching is carried out in an etching solution of one or more selected from the group consisting of ammonia hydrogen peroxide, ammonia, KOH, NaOH, CsOH, tetramethylammonium hydroxide (TMAH), ethylenediamine pyrocatechol (EDP) and hydrazine.

* * * * *